US010236842B2

United States Patent
Michal et al.

(10) Patent No.: US 10,236,842 B2
(45) Date of Patent: Mar. 19, 2019

(54) VOLTAGE DETECTOR CIRCUIT

(71) Applicants: STMicroelectronics (Alps) SAS, Grenoble (FR); STMicroelectronics (Grenoble 2) SAS, Grenoble (FR)

(72) Inventors: Vratislav Michal, Grenoble (FR); Michel Ayraud, Voreppe (FR)

(73) Assignees: STMICROELECTRONICS (ALPS) SAS, Grenoble (FR); STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 15/393,485

(22) Filed: Dec. 29, 2016

(65) Prior Publication Data
US 2018/0191318 A1 Jul. 5, 2018

(51) Int. Cl.
H03F 3/45 (2006.01)
H03F 1/02 (2006.01)
G01R 1/30 (2006.01)
G01R 31/36 (2019.01)

(52) U.S. Cl.
CPC .......... H03F 3/45179 (2013.01); G01R 1/30 (2013.01); G01R 31/362 (2013.01); G01R 31/3682 (2013.01); H03F 1/0205 (2013.01); H03F 2200/129 (2013.01); H03F 2203/45151 (2013.01)

(58) Field of Classification Search
CPC ............... H03F 3/45071; H03F 1/0205; H03F 3/45179; H03F 1/3211; H03F 3/45; H03F 3/45076; H03F 3/4508; H03F 3/45085; H03F 2203/45138; G01R 1/30; G01R 31/362; G01R 31/3682

USPC .................................................. 330/257, 288
See application file for complete search history.

(56) References Cited

U.S. PATENT DOCUMENTS 7,432,758 B2 * 10/2008 Chou ........................ G05F 1/56
323/277
7,586,371 B2 * 9/2009 Tachibana ............... H03F 3/347
330/253

(Continued)

OTHER PUBLICATIONS

"Battery Performance Characteristics—How to specify and test a battery," Battery and Energy Technologies, Electropaedia, http://www.mpoweruk.com/performance.htm, 6 pages, printed Dec. 12, 2016.

Primary Examiner — Khanh V Nguyen
(74) Attorney, Agent, or Firm — Slater Matsil, LLP

(57) ABSTRACT

A circuit includes an amplifier having a first power terminal configured to be coupled to a supply voltage and a second power terminal configured to be coupled to a reference potential. The circuit further includes a first impedance element coupled between a first input terminal of the amplifier and a first output terminal of the amplifier. The circuit additionally includes a second impedance element coupled between the first input terminal and the reference potential. The amplifier is configured to output a first voltage at a second output terminal of the amplifier in response to the supply voltage being greater than an output voltage at the first output terminal of the amplifier. The amplifier is further configured to output a second voltage at the second output terminal of the amplifier in response to the supply voltage being less than the output voltage at the first output terminal of the amplifier.

20 Claims, 5 Drawing Sheets

(56) References Cited

U.S. PATENT DOCUMENTS

| | | | |
|---|---|---|---|
| 8,766,610 B2* | 7/2014 | Imura | H03F 1/223 |
| | | | 323/280 |
| 2004/0189385 A1* | 9/2004 | Shor | H03F 3/211 |
| | | | 330/253 |
| 2008/0197829 A1* | 8/2008 | Nagata | G05F 3/262 |
| | | | 323/316 |

* cited by examiner

VOLTAGE DETECTOR CIRCUIT

TECHNICAL FIELD

The present disclosure relates generally to voltage detectors, and, in particular embodiments, to a voltage detector circuit for monitoring whether a batter voltage in a device is below predetermined threshold.

BACKGROUND

In many battery operated devices, voltage detectors are used to monitor the battery output voltage and identify to a control circuit, such as a microprocessor, when the battery output voltage falls below a predetermined threshold. In some cases, the predetermined threshold may be the minimum voltage at which the device may safely operate according to specification and without loss or corruption or data. In response to a determination that the battery output voltage has fallen below the predetermined threshold, the control circuit may issue a warning signal to an operator or may prevent further operation of the device in order to avoid any malfunction or loss of data. It may be desirable to provide voltage detectors that have a low manufacturing cost, a small size, an accurate detection of voltage over the entire supply voltage range and temperature range, and low power consumption.

SUMMARY

In an embodiment, a circuit may include an amplifier having a first power terminal configured to be coupled to a supply voltage and a second power terminal configured to be coupled to a reference potential. The circuit may further include a first impedance element coupled between a first input terminal of the amplifier and a first output terminal of the amplifier. The circuit may additionally include a second impedance element coupled between the first input terminal and the reference potential. The amplifier may be configured to output a first voltage at a second output terminal of the amplifier in response to the supply voltage being greater than an output voltage at the first output terminal of the amplifier. The amplifier may be further configured to output a second voltage at the second output terminal of the amplifier in response to the supply voltage being less than the output voltage at the first output terminal of the amplifier.

In an embodiment, a circuit includes a first transistor, a second transistor, a third transistor, a fourth transistor, and a fifth transistor. The first transistor may have a first conductivity type, and the second transistor may have the first conductivity type. Source terminals of the first transistor and the second transistor are coupled to each other, and gate terminals of the first transistor and the second transistor are configured to receive a bandgap reference voltage. The third transistor may have a second conductivity type, and a drain terminal and a gate terminal of the third transistor are coupled to a drain terminal of the first transistor. The fourth transistor may have the second conductivity type, and a gate terminal and a drain terminal of the fourth transistor are coupled to the gate terminal of the third transistor and a drain terminal of the second transistor, respectively. The fifth transistor may have the second conductivity type, and a drain terminal of the fifth transistor is coupled to a first output terminal. A source terminal of the fifth transistor is coupled to a supply voltage, and a gate terminal of the fifth transistor is coupled to the drain terminal of the fourth transistor and a second output terminal. The fifth transistor is configured to operate in a first mode when the supply voltage is greater than a first output voltage at the first output terminal, and in a second mode when the supply voltage is less than the first output voltage at the second output terminal.

In an embodiment, an operational amplifier, a first impedance element, a second impedance element, and a transistor. The operational amplifier includes a non-inverting input terminal, an inverting input terminal, a first output terminal, and a second output terminal. The operational amplifier further includes a first power terminal configured to be coupled to a supply voltage and a second power terminal configured to be coupled to a reference potential. The non-inverting input terminal of the operational amplifier may be to receive a bandgap reference voltage. The first impedance element is coupled between the first output terminal of the operational amplifier and the inverting input terminal of the operational amplifier. The second impedance element is coupled between the inverting input terminal of the operational amplifier and the reference potential. The transistor includes a gate terminal coupled to the second output terminal of the operational amplifier. The transistor further includes a source terminal configured to be coupled to the supply voltage, and a drain terminal configured to provide a voltage to an input terminal of a digital buffer. An operation of the transistor is controlled by a difference between the supply voltage and an voltage at the first output terminal of the operational amplifier.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Figure 1:
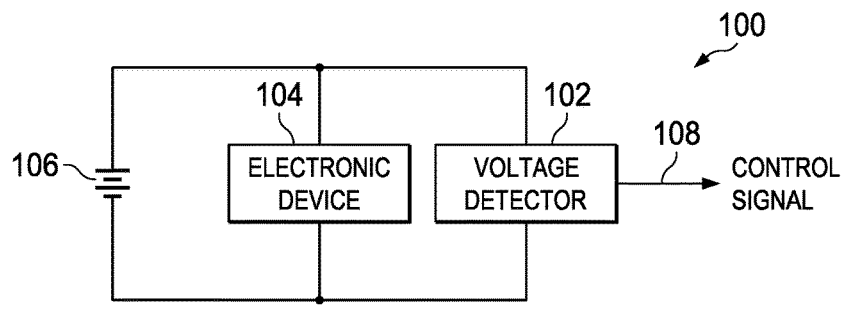
FIG. 1 shows a voltage detection system 100, in accordance with an embodiment.

FIG. 1 shows a voltage detection system 100, in accordance with an embodiment. The voltage detection system 100 includes a voltage detector 102, an electronic device 104, and a power supply 106. The electronic device 104 may be a mobile device, a memory device, or any other electronic device. In some embodiments, the power supply 106 may be a battery included within or external to the electronic device 104. The power supply 106 supplies power to the electronic device 104 and the voltage detector 102. The voltage detector 102 may be included within or external to the electronic device 104. In one example, the voltage detector 102 may be an accessory box attached to the electronic device 104.

The voltage detector 102 is configured to determine whether the voltage supplied by the power supply 106 to the electronic device 104 is within an acceptable range of values. For example, the voltage detector 102 may be configured to determine whether the voltage supplied by the power supply 106 is below a predetermined threshold. In response to a determination that the voltage supplied by the power supply 106 is below the predetermined threshold, the voltage detector 102 may be configured to provide a control signal 108 to a control circuit (e.g. a microprocessor, not shown in FIG. 1) that may issue a warning indicating that the power supply 106 needs to be replaced, as an example. In some examples, the control signal 108 may switch from a first voltage level (e.g. a logical high) to a second voltage level (e.g. a logical low) in response to a determination (e.g. by the voltage detector 102) that the voltage supplied by the power supply 106 is below the predetermined threshold.

The electronic device 104 may, in some embodiments, be a low power device (e.g. a device that operates between about 1 V and about 5 V). In such examples, it may be desirable that the voltage supplied by the power supply 106 to the electronic device 104 be above the predetermined threshold in order to avoid malfunction of the electronic device 104 or loss or corruption of data (e.g. in examples where the electronic device 104 stores data). As such, the predetermined threshold may be regarded as the minimum voltage at which the electronic device 104 may safely function according to specification and without malfunction or loss of data. In some embodiments, the above-described predetermined threshold may be referred to as a minimum tolerable supply voltage $V_{MIN}$.

Figure 2:
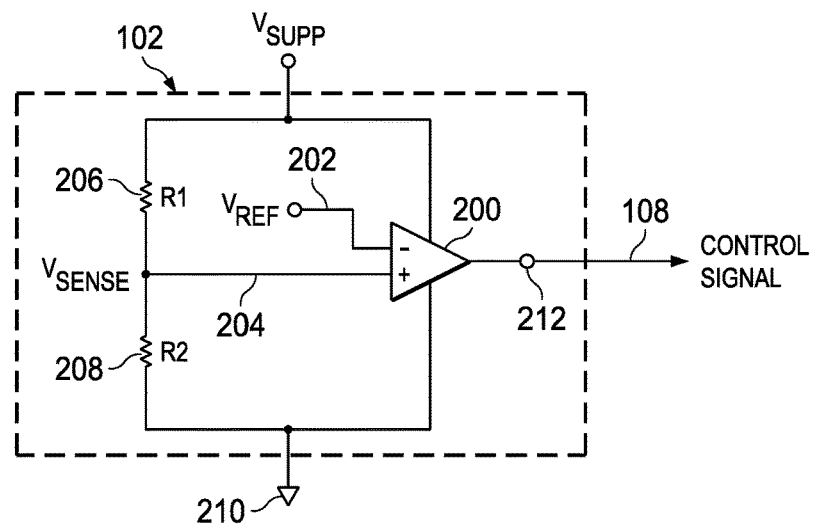
FIG. 2 schematically shows a conventional voltage detector that may be used in the voltage detection system shown in FIG. 1.

FIG. 2 schematically shows a conventional voltage detector 102 that may be used in the voltage detection system 100 shown in FIG. 1. The voltage detector 102 shown in FIG. 2 may include an amplifier 200 (e.g. an operational amplifier) having a first input terminal 202 and a second input terminal 204. In the example shown in FIG. 2, the first input terminal 202 and the second input terminal 204 are the inverting input and the non-inverting input of the amplifier 200, respectively. The voltage detector 102 also includes a first impedance element 206 and a second impedance element 208 coupled between a supply voltage $V_{SUPP}$ and a reference potential 210. The supply voltage $V_{SUPP}$ may be the voltage supplied by the power supply 106 to the electronic device 104 and the amplifier 200. In some examples, the reference potential 210 may be a ground potential of the power supply 106 (e.g. about 0 V).

A stable (e.g. a fixed) bandgap reference voltage $V_{REF}$ may be provided to the first input terminal 202 of the amplifier 200. In the description that follows, the bandgap reference voltage is referred to as a bandgap voltage. In some examples, the bandgap voltage $V_{REF}$ may be provided by a circuit, included in the voltage detector 102, having one or more current sources and one or more resistive elements. The circuit that provides the bandgap voltage $V_{REF}$ to the first input terminal 202 is not shown in FIG. 2 for the sake of simplicity. The bandgap voltage $V_{REF}$ may be in the range of from about 1V to about 1.5 V (e.g. about 1.2 V) and may be greater than a threshold voltage of a transistor included in the amplifier 200. As an example, the threshold voltage of a field effect transistor may be the minimum gate-to-source voltage that is needed to create a conducting path between source and drain terminals of the field effect transistor included in the amplifier 200. The first impedance element 206 and the second impedance element 208 may include resistors that form a resistive divider circuit that provides a sensed voltage $V_{SENSE}$ to the second input terminal 204 (e.g. the non-inverting terminal) of the amplifier 200. For example, if R1 and R2 are the resistance values of the first impedance element 206 and the second impedance element 208, respectively, then $V_{SENSE}$ may be expressed as $R2 \cdot V_{SUPP}/(R1+R2)$.

In some examples, the supply voltage $V_{SUPP}$ provided by the power supply 106 to the electronic device 104 and the amplifier 200 may drift (e.g. decrease) over time, e.g. due to wear and tear or charge leakage over time, or both. The drift in the supply voltage $V_{SUPP}$ may also be caused by other factors known in the art. Consequently, the sensed voltage $V_{SENSE}$ can also drift over time. In cases where the sensed voltage $V_{SENSE}$ is greater than the bandgap voltage $V_{REF}$, the control signal 108 outputted at a first output terminal 212 of the amplifier 200 may be a first voltage level (e.g. a logical high), thereby indicating that the voltage supplied to the electronic device 104 is above or equal to the minimum tolerable supply voltage $V_{MIN}$. On the other hand, in cases where the sensed voltage $V_{SENSE}$ is less than the bandgap voltage $V_{REF}$, the control signal 108 outputted at the first output terminal 212 of the amplifier 200 may be a second voltage level (e.g. a logical low), thereby indicating that the voltage supplied to the electronic device 104 is below the minimum tolerable supply voltage $V_{MIN}$. Consequently, the resistance values of the first impedance element 206 and the second impedance element 208 may be chosen such that the sensed voltage $V_{SENSE}$ is substantially equal to the bandgap voltage $V_{REF}$ when the supply voltage $V_{SUPP}$ is at the minimum tolerable supply voltage $V_{MIN}$. For example, the bandgap voltage $V_{REF}$ may be about 1.2 volts, and if the minimum tolerable battery voltage is about 2.4 volts, then values of the first impedance element 206 and the second impedance element 208 are chosen to be equal such that when the battery voltage is below 2.4 volts, the sensed voltage $V_{SENSE}$ at the second input terminal 204 of the amplifier 200 is below the bandgap voltage $V_{REF}$. In such an example, the output of the amplifier 200 goes low to indicate a low voltage condition in the power supply 106.

A feature of the voltage detector 102 shown in FIG. 2 is that the power consumed by the resistive divider circuit formed by the first impedance element 206 and the second impedance element 208 varies over time. For example, suppose the maximum voltage that may be provided by the power supply 106 is denoted as $V_{MAX}$, then the maximum power that may be consumed by the resistive divider circuit formed by the first impedance element 206 and the second impedance element 208 may be denoted as $V_{MAX}^2/(R1+R2)$, where R1 and R2 are the resistance values of the first impedance element 206 and the second impedance element 208, respectively. Furthermore, as the supply voltage $V_{SUPP}$ provided by the power supply 106 decreases over time (e.g. due to wear and tear and charge leakage over time), the current flowing through the first impedance element 206 and the second impedance element 208 (which may be expressed as $V_{SUPP}/(R1+R2)$) also decreases over time, thereby causing the power consumed by the voltage detector 102 to decrease over time. As such, the power consumed by the voltage detector 102 is dependent on the supply voltage $V_{SUPP}$. However, in applications where the electronic device 104 is a low power device, such temporal variation in the power consumed by the voltage detector 102 may unnecessarily and detrimentally expend power that may otherwise be used by the electronic device 104. For example, when a newly-installed power supply 106 is used in the voltage detection system 100, the maximum power $V_{MAX}^2/(R1+R2)$ consumed by the resistive divider circuit formed by the first impedance element 206 and the second impedance element 208 may be impermissibly high and may unnecessarily deplete charge in the power supply 106, thereby accelerating the decrease in the supply voltage $V_{SUPP}$ provided by the power supply 106. As such, it may be desirable to provide a voltage detector in the voltage detection system 100 that consumes a constant and low current during its operation. It may be desirable for such current to be less than the current $V_{SUPP}/(R1+R2)$ flowing through the first impedance element 206 and the second impedance element 208 shown in FIG. 1. It may be desirable to provide a voltage detector in which power consumption is independent of the supply voltage $V_{SUPP}$ provided by the power supply 106. Furthermore, it may be desirable to provide a voltage detector that is robust against process, voltage, and temperature (PVT) variations. Finally, it may be desirable that the manufacturing cost of such a voltage detector be low.

Figure 7:
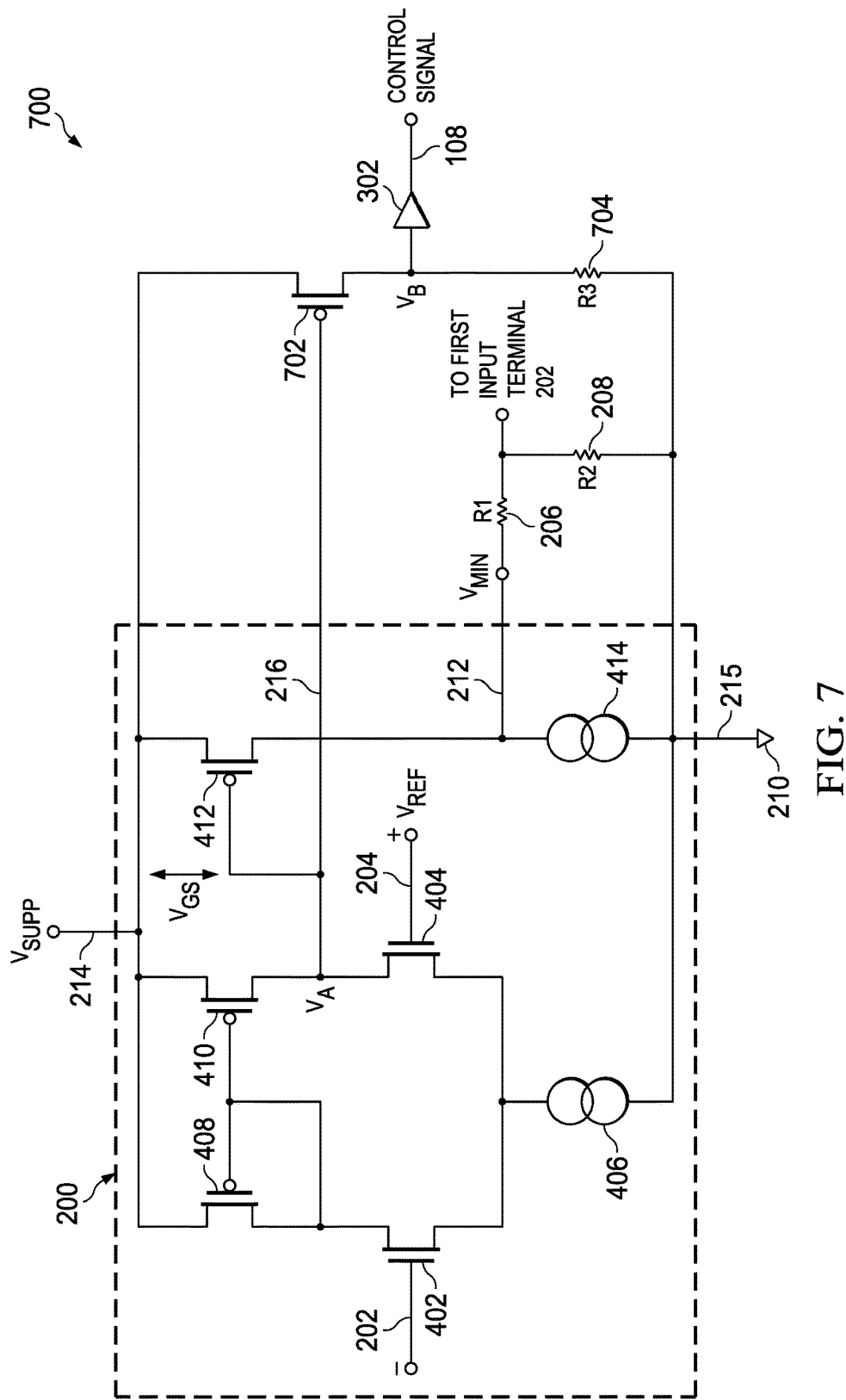
FIG. 7 shows a voltage detector, in accordance with another embodiment.

Embodiment voltage detectors described below provide the above-described effects. In particular, the embodiment voltage detectors depicted in FIGS. 3, 4, and 7 provide the above-described effects of constant and low current during its operation, power consumption that is independent of the supply voltage $V_{SUPP}$ provided by the power supply 106, robustness against PVT variations, and low manufacturing cost.

Figure 3:
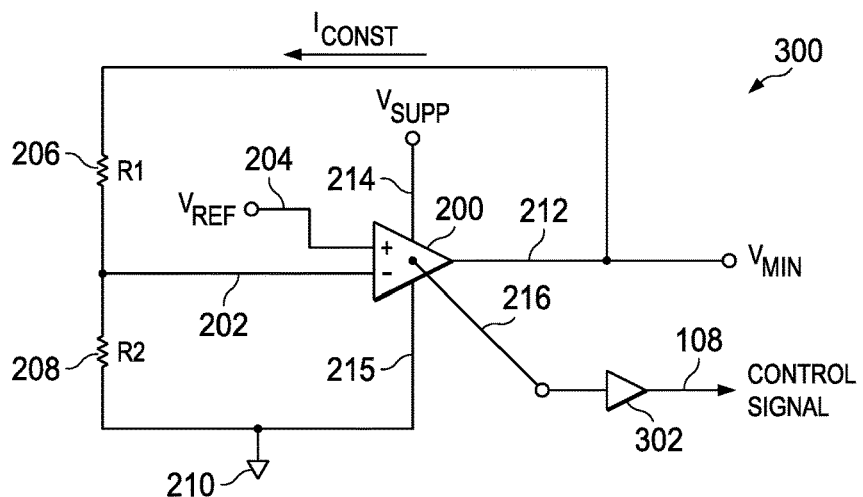
FIG. 3 schematically shows a voltage detector, in accordance with an embodiment.
Figure 4:
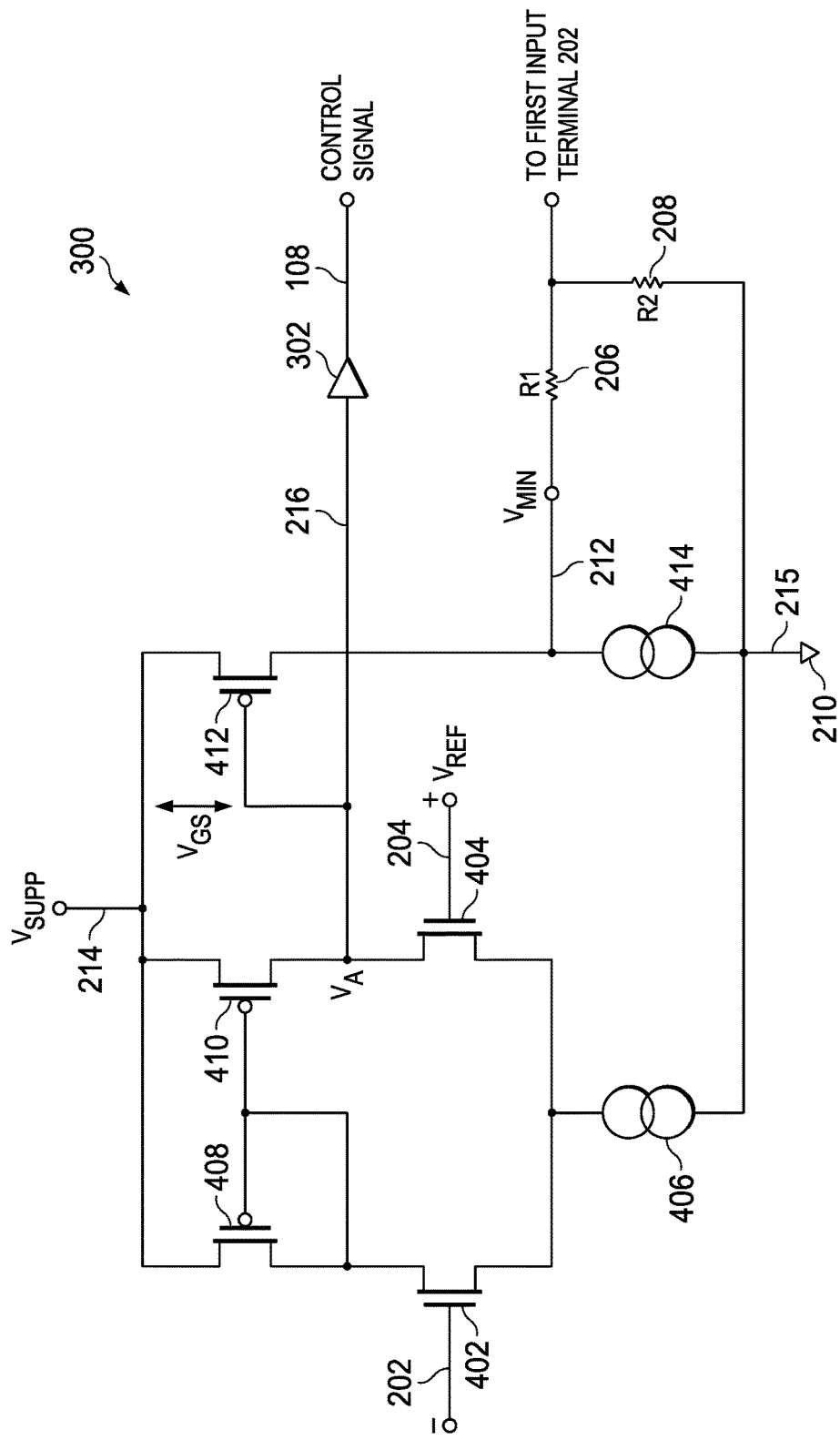
FIG. 4 shows the internal circuitry of the voltage detector shown in FIG. 3, in accordance with an embodiment.

FIG. 3 schematically shows a voltage detector 300, in accordance with an embodiment. The voltage detector 300 may be used in the voltage detection system 100 shown in FIG. 1, and may be used to replace the conventional voltage detector 102 depicted in FIGS. 1 and 2. As shown in FIG. 3, the voltage detector 300 may include the amplifier 200 described above in respect of FIG. 2. In contrast to the schematic diagram shown in FIG. 2, the bandgap voltage $V_{REF}$ (e.g. about 1V to about 2 V) is provided to the second input terminal 204 (e.g. the non-inverting terminal) of the amplifier 200. Furthermore, in contrast to the schematic diagram shown in FIG. 2, the amplifier 200 functions as a non-inverting amplifier, and thus, the bandgap voltage $V_{REF}$ is amplified by the amplifier 200 to produce the minimum tolerable supply voltage $V_{MIN}$ at the first output terminal 212 of the amplifier 200. As an example, the minimum tolerable supply voltage $V_{MIN}$ can be delivered at the first output terminal 212 of the amplifier 200 by choosing appropriate resistance values R1 and R2 for the first impedance element 206 and the second impedance element 208, respectively, such that $V_{MIN}=(R1+R2) \cdot V_{REF}/R1$.

As can be seen in FIG. 3, the current $I_{CONST}$ flowing through the resistive divider circuit formed by the first impedance element 206 and the second impedance element 208 is delivered by the minimum tolerable supply voltage $V_{MIN}$ outputted at the first output terminal 212 of the amplifier 200. This is in contrast to the circuit shown in FIG. 2, where the current flowing through the resistive divider circuit formed by the first impedance element 206 and the second impedance element 208 is delivered by the supply voltage $V_{SUPP}$. Additionally, as known in the art, once the resistances of the first impedance element 206 and the second impedance element 208 are fixed, the first output terminal 212 of the amplifier 200 delivers a constant current. Thus, the current $I_{CONST}$ flowing through the resistive divider circuit formed by the first impedance element 206 and the second impedance element 208 is a constant current that is independent of the supply voltage $V_{SUPP}$. In particular, the current $I_{CONST}$ may be denoted as $V_{MIN}/(R1+R2)$. This feature of the voltage detector 300 in FIG. 3 is in contrast to the conventional voltage detector 102 shown in FIG. 2, where the current flowing through the resistive divider circuit formed by the first impedance element 206 and the second impedance element 208 is variable and depends, at least in part, on the supply voltage $V_{SUPP}$.

As described above, the supply voltage $V_{SUPP}$ provided by the power supply 106 may drift (e.g. decrease) over time, e.g. due to wear and tear, charge leakage over time, or other reasons. This supply voltage $V_{SUPP}$ is provided to a first power terminal 214 of the amplifier 200, as shown in FIG. 3. A second power terminal 215 of the amplifier 200 may be connected to the reference potential 210 (e.g. ground potential of the power supply 106, which may be about 0 V). As such, when the supply voltage $V_{SUPP}$ falls below the minimum tolerable supply voltage $V_{MIN}$, the amplifier 200 may be unable to generate the minimum tolerable supply voltage $V_{MIN}$ at the first output terminal 212. This causes the amplifier 200 to saturate. On the other hand, when the supply voltage $V_{SUPP}$ is above the minimum tolerable supply voltage $V_{MIN}$, the amplifier 200 may operate in a linear region and the amplifier 200 may be able to generate the minimum tolerable supply voltage $V_{MIN}$ at the first output terminal 212. As such, the amplifier 200 may operate in the linear regime when the supply voltage $V_{SUPP}$ is above the minimum tolerable supply voltage $V_{MIN}$, but may operate in the saturated mode when the supply voltage $V_{SUPP}$ is below the minimum tolerable supply voltage $V_{MIN}$. Consequently, in the voltage detector 300 shown in FIG. 3, a determination of whether the amplifier 200 is operating in the linear regime or in the saturated mode can be used to indicate whether the supply voltage $V_{SUPP}$ provided by the power supply 106 is above or below the minimum tolerable supply voltage $V_{MIN}$. For example, a voltage outputted at a second output terminal 216 of the amplifier 200 may be indicative of whether the amplifier 200 is operating in the linear regime or in the saturated mode. The control signal 108 may be generated based on the voltage outputted at the second output terminal 216 of the amplifier 200. For example, a digital buffer 302 may compare the voltage outputted at the second output terminal 216 of the amplifier 200 against a threshold and a voltage above such a threshold causes the control signal 108 to be at a first voltage level (e.g. a logical high), while a voltage below such a threshold causes the control signal 108 to be at a second voltage level (e.g. a logical low). As such, the control signal 108 may be indicative of whether the voltage supplied by the power supply 106 is below or above the minimum tolerable supply voltage $V_{MIN}$.

FIG. 4 shows the internal circuitry of the voltage detector 300 shown in FIG. 3, in accordance with an embodiment. As depicted in FIG. 4, the voltage at the first input terminal 202 (e.g. the inverting input) is applied to the gate of a first transistor 402 and the bandgap voltage $V_{REF}$ at the second input terminal 204 (e.g. non-inverting input) is applied to the gate of a second transistor 404. The first transistor 402 and the second transistor 404 have the same conductivity type, and in the example shown in FIG. 4, the first transistor 402 and the second transistor 404 are implemented using NMOS transistors. The source terminals of the first and second transistors 402 and 404 are connected together (e.g. tied to each other) and to a first constant current source 406. In some embodiments, the first constant current source 406 may be implemented using a transistor having the same conductivity type as the first and second transistors 402 and 404. For example, the first constant current source 406 may be an NMOS transistor having a drain terminal, a source terminal, and a gate terminal, where its drain terminal is connected to the source terminals of the first and second transistors 402 and 404, its gate terminal has a specific bias voltage applied thereto, and its source terminal is connected to the reference potential 210 (e.g. ground potential of the power supply 106, which may be about 0 V).

As depicted in FIG. 4, the drain terminal of the first transistor 402 is connected to a drain terminal and a gate terminal of a third transistor 408. The source terminal of the third transistor 408 is connected to the supply voltage $V_{SUPP}$. Additionally, a gate terminal of a fourth transistor 410 is connected to the gate terminal of the third transistor 408, while the source terminal of the fourth transistor 410 is connected to the supply voltage $V_{SUPP}$. Furthermore, the drain terminal of the fourth transistor 410 is connected to the drain terminal of the second transistor 404 to allow an output voltage $V_A$ to be outputted through the drain terminal of the fourth transistor 410 to the second output terminal 216 of the amplifier 200. The third transistor 408 and the fourth transistor 410 have the same conductivity type, and in the example shown in FIG. 4, the third transistor 408 and the fourth transistor 410 are implemented using PMOS transistors.

Amplification in the amplifier 200 may be accomplished by a fifth transistor 412. The fifth transistor 412 has the same conductivity type as the third transistor 408 and the fourth transistor 410, and in the example shown in FIG. 4, the fifth transistor 412 is implemented using a PMOS transistor. A gate terminal of the fifth transistor 412 is connected to the drain terminal of the fourth transistor 410 and the second output terminal 216 of the amplifier 200. Additionally, a source terminal of the fifth transistor 412 is connected to the supply voltage $V_{SUPP}$, and a drain terminal of the fifth transistor 412 may be connected to a second constant current source 414. The second constant current source 414 may be implemented using similar circuitry as the first constant current source 406. Furthermore, the drain terminal of the fifth transistor 412 is connected to the first output terminal 212 of the amplifier 200 and the voltage at the drain terminal of the fifth transistor 412 is outputted at the first output terminal 212 of the amplifier 200.

During operation, when the supply voltage $V_{SUPP}$ is greater than the minimum tolerable supply voltage $V_{MIN}$ at the first output terminal 212 of the amplifier 200, the fifth transistor 412 may operate in the linear region and the minimum tolerable supply voltage $V_{MIN}$ may be able to be generated at the drain terminal of the fifth transistor 412 (and consequently at the first output terminal 212 of the amplifier 200). In the linear region, the gate-to-source voltage of the fifth transistor 412 is substantially equal to the threshold voltage of the fifth transistor 412, which in some embodiments is about 0.6 V to about 0.9 V (e.g. about 0.8 V). As such, the output voltage $V_A$ at the drain terminal of the fourth transistor 410 is about 0.6 V to about 0.9 V less than the supply voltage $V_{SUPP}$, and this output voltage $V_A$ is outputted at the second output terminal 216 of the amplifier 200. On the other hand, when the supply voltage $V_{SUPP}$ is less than the minimum tolerable supply voltage $V_{MIN}$, the fifth transistor 412 may operate in the saturation region and thus, the gate voltage of the fifth transistor 412 is substantially equal to the ground potential of the power supply 106 (e.g. about 0 V). As such, the output voltage $V_A$ at the drain terminal of the fourth transistor 410 is reduced to the ground potential (e.g. about 0 V), and this output voltage $V_A$ is outputted at the second output terminal 216 of the amplifier 200.

Figure 5:
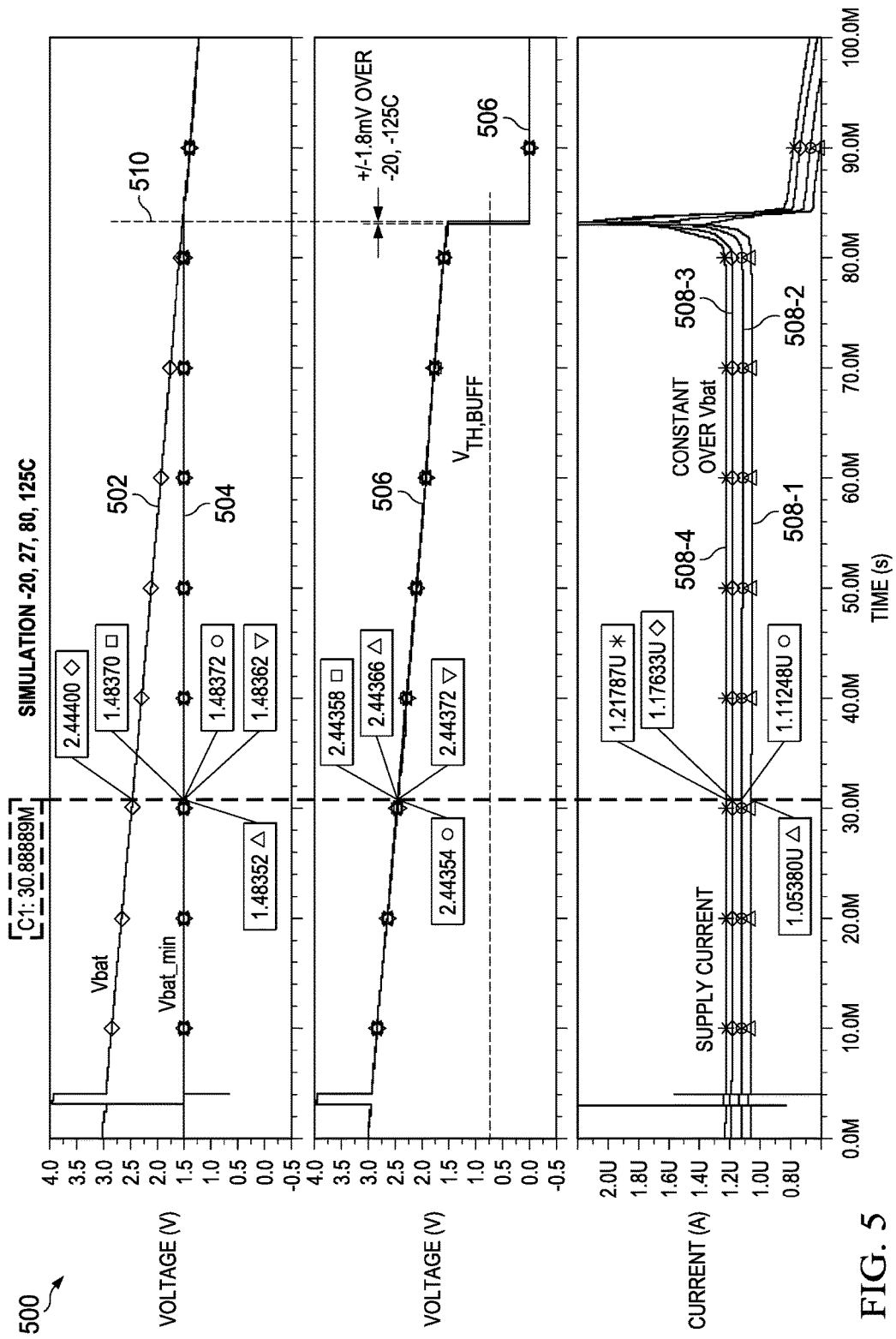
FIG. 5 shows various voltage and current curves obtained from simulations performed using the internal circuitry shown in FIG. 4, in accordance with an embodiment.

FIG. 5 shows various voltage and current curves 500 obtained from simulations performed using the internal circuitry shown in FIG. 4, in accordance with an embodiment. FIG. 5 shows curves 502 and 504, which depict the supply voltage $V_{SUPP}$ and the minimum tolerable supply voltage $V_{MIN}$, respectively. As shown in FIG. 5, when the supply voltage $V_{SUPP}$ is greater than the minimum tolerable supply voltage $V_{MIN}$, the fifth transistor 412 is operating in the linear mode, and the output voltage $V_A$ that is outputted at the second output terminal 216 of the amplifier 200 (depicted in FIG. 5 as curve 506) is a non-zero voltage that tracks the supply voltage $V_{SUPP}$. Furthermore, the current $I_{CONST}$ flowing through the resistive divider circuit formed by the first impedance element 206 and the second impedance element 208 (depicted in FIG. 5 as curves 508-1 to 508-4) is constant while the fifth transistor 412 is operating in the linear mode. However, when the supply voltage $V_{SUPP}$ falls below the minimum tolerable supply voltage $V_{MIN}$ (e.g. at the time denoted by the line 510 in FIG. 5), the fifth transistor 412 switches operation to the saturation mode. As such, the output voltage $V_A$ that is outputted at the second output terminal 216 of the amplifier 200 falls to the ground potential (e.g. about 0 V) and remains at the ground potential (e.g. 0 V) for as long as the supply voltage $V_{SUPP}$ is below the minimum tolerable supply voltage $V_{MIN}$.

As can be seen in FIG. 5, the output voltage $V_A$ at the drain terminal of the fourth transistor 410 switches from the minimum tolerable supply voltage $V_{MIN}$ to the ground potential at approximately the time the supply voltage $V_{SUPP}$ falls below the minimum tolerable supply voltage $V_{MIN}$ (e.g. at time denoted by the line 510 in FIG. 5). As described above, the digital buffer 302 may compare the voltage outputted at the second output terminal 216 of the amplifier 200 against a threshold and a voltage above such a threshold causes the control signal 108 to be at a first voltage level (e.g. a logical high), while a voltage below such a threshold causes the control signal 108 to be at a second voltage level (e.g. a logical low). The threshold for the digital buffer 302 may be set to be equal to about $V_{MIN}/2$ in order for the digital buffer 302 to output the first voltage level (e.g. logical high) when the fifth transistor 412 is operating in the linear mode and the second voltage level (e.g. logical low) when the fifth transistor 412 is operating in the saturation mode. The threshold for the digital buffer 302 is indicated in FIG. 5 as $V_{TH,BUFF}$. For example, the digital buffer 302 outputs the first voltage level (e.g. logical high) in response to its input voltage being above or equal to about $V_{MIN}/2$ and the second voltage level (e.g. logical low) in response to its input voltage being less than about $V_{MIN}/2$, thus allowing indication of whether the voltage supplied by the power supply 106 is below the minimum tolerable supply voltage $V_{MIN}$.

The simulations shown in FIG. 5 were performed for various temperatures. These temperatures include −20 degrees Celsius, 27 degrees Celsius, 80 degrees Celsius, and 125 degrees Celsius, and the current $I_{CONST}$ flowing through the resistive divider circuit formed by the first impedance element 206 and the second impedance element 208 for each of these temperatures is depicted in FIG. 5 as curves 508-1,

508-2, 508-3, and 508-4, respectively. FIG. 5 shows that for a given temperature, the current $I_{CONST}$ flowing through the resistive divider circuit formed by the first impedance element 206 and the second impedance element 208 is constant while the fifth transistor 412 is operating in the linear mode.

As shown in FIG. 5, the output voltage $V_A$ at the drain terminal of the fourth transistor 410 switches from the minimum tolerable supply voltage $V_{MIN}$ to about 0 V at approximately the time the supply voltage $V_{SUPP}$ falls below the minimum tolerable supply voltage $V_{MIN}$ (e.g. at time denoted by the line 510 in FIG. 5). However, the transistors 402, 404, 408, 410, and 412 shown in FIG. 4 may operate with different threshold voltages during the circuit life of the voltage detector 300. This may be caused by charged carriers penetrating, to different extents, into the oxides of the transistors 402, 404, 408, 410, and 412, thereby creating different offsets in the threshold voltages of the transistors 402, 404, 408, 410, and 412. This offset in the threshold voltages of the transistors 402, 404, 408, 410, and 412 can be up to about 100 mV (e.g. between about 10 mV and 100 mV). This difference in threshold voltages among the transistors 402, 404, 408, 410, and 412 is further multiplied by the feedback networks present in the voltage detector 300 shown in FIGS. 3 and 4. As such, the transistors 402, 404, 408, 410, and 412 may turn on and off at different threshold voltages, and this can negatively affect the switching of the output voltage $V_A$ at the drain terminal of the fourth transistor 410 from the minimum tolerable supply voltage $V_{MIN}$ to the ground potential (e.g. about 0 V). For example, switching of the output voltage $V_A$ at the drain terminal of the fifth transistor 412 may occur a considerable amount of time after the supply voltage $V_{SUPP}$ falls below the minimum tolerable supply voltage $V_{MIN}$, thereby creating a risk that a low power condition of the power supply 106 goes undetected for some extended period of time. This, in turn, increases the risk of malfunction of the electronic device 104 or loss or corruption of data that may be stored therein.

This risk is inherently, intrinsically, and automatically eliminated or substantially reduced by the voltage detector 300 shown in FIGS. 3 and 4 since the voltage at the first input terminal 202 of the amplifier 200 is substantially equal to the bandgap voltage $V_{REF}$ that is provided at the second input terminal 204 of the amplifier 200. For example, since $V_{MIN}=(R1+R2)\cdot V_{REF}/R1$ and the voltage at the first input terminal 202 of the amplifier 200 is R1 $V_{MIN}/(R1+R2)$, it follows that the voltage at the first input terminal 202 of the amplifier 200 is equal to the bandgap voltage $V_{REF}$. Consequently, the voltage detector 300 shown in FIGS. 3 and 4 can operate with a zero differential input voltage, thus substantially cancelling the drift of the threshold voltages of the transistors 402, 404, 408, 410, and 412. As shown in the simulations of FIG. 5, the switching of the output voltage $V_A$ at the drain terminal of the fourth transistor 410 from the minimum tolerable supply voltage $V_{MIN}$ to the ground potential (e.g. about 0 V) occurs when the output voltage $V_A$ is about 2 mV from the minimum tolerable supply voltage $V_{MIN}$ (which is, in itself, in a range of about 1 V to about 3 V). Furthermore, this spread of about 2 mV around the minimum tolerable supply voltage $V_{MIN}$ is observed over all temperatures simulated, thus exhibiting the robustness of the voltage detector 300 shown in FIGS. 3 and 4 against PVT variations.

Figure 6:
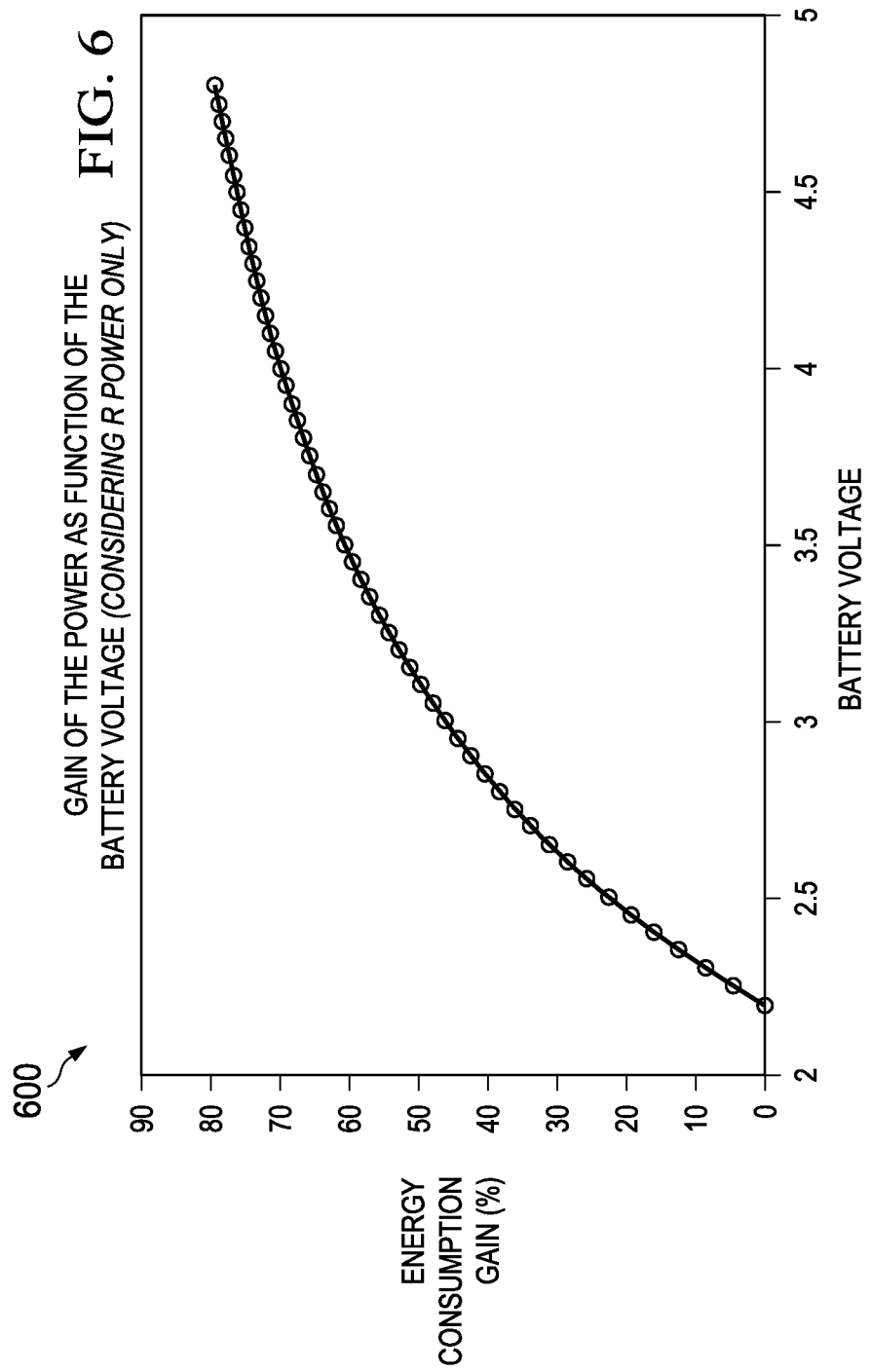
FIG. 6 shows the instantaneous power savings obtained by the voltage detector shown in FIGS. 3 and 4 in comparison to the conventional voltage detector shown in FIG. 2, in accordance with an embodiment.

As described above in relation to FIG. 2, the maximum instantaneous power that may be consumed by the resistive divider circuit in the conventional voltage detector 102 may be denoted as $V_{MAX}^2/(R1+R2)$, where $V_{MAX}$ is the maximum voltage that may be provided by the power supply 106, and where R1 and R2 are the resistance values of the first impedance element 206 and the second impedance element 208, respectively. On the other hand, the maximum instantaneous power that may be consumed by the resistive divider circuit in the voltage detector 300 shown in FIGS. 3 and 4 may be denoted as $V_{MIN}^2/(R1+R2)$, and this instantaneous power is constant regardless of the supply voltage $V_{SUPP}$ due to the constant current $I_{CONST}$ flowing through the resistive divider circuit formed by the first impedance element 206 and the second impedance element 208. As such, the voltage detector 300 consumes $V_{MIN}^2/V_{MAX}^2$ less power than the conventional voltage detector 102 shown in FIG. 2. FIG. 6 shows the instantaneous power savings obtained by the voltage detector 300 in comparison to the conventional voltage detector 102, in accordance with an embodiment where the minimum tolerable supply voltage $V_{MIN}$ is about 2.25 V and the maximum voltage $V_{MAX}$ that may be provided by the power supply 106 is about 4.8 V. As depicted in FIG. 6, instantaneous power savings of up to about 80% may be obtained by the voltage detector 300 in comparison to the conventional voltage detector 102.

FIG. 7 shows a voltage detector 700, in accordance with another embodiment. The voltage detector 700 shown in FIG. 7 provides greater robustness against PVT variations and a more accurate indication of whether the fifth transistor 412 is in the linear mode or the saturation mode in comparison to the voltage detector 300 shown in FIGS. 3 and 4. In particular, better control of the switching of the digital buffer 302 is provided by the voltage detector 700 shown in FIG. 7. The voltage detector 700 shown in FIG. 7 may, as an example, be used in applications where the minimum tolerable supply voltage $V_{MIN}$ is in a range from about 1 V to about 2 V (e.g. about 1.6 V). As shown in FIG. 7, the voltage detector 700 includes a sixth transistor 702 having the same conductivity type as the fifth transistor 412. In the example shown in FIG. 7, the sixth transistor 702 is implemented by a PMOS transistor. A gate terminal of the sixth transistor 702 is connected to the gate terminal of the fifth transistor 412. Additionally, the source terminal of the sixth transistor 702 is connected to the supply voltage $V_{SUPP}$, while the drain terminal of the sixth transistor 702 is coupled to the reference potential 210 (e.g. ground potential of the power supply 106) through a third impedance element 704 having a resistance value $R_3$. Furthermore, an input terminal of the digital buffer 302 is connected to the drain terminal of the sixth transistor 702. The digital buffer 302 generates the control signal 108 based on the voltage outputted at the drain terminal of the sixth transistor 702.

As described above, the threshold $V_{TH,BUFF}$ for the digital buffer 302 is about $V_{MIN}/2$, and in FIG. 7, a channel width and/or channel length of the sixth transistor 702 and the resistance $R_3$ of the third impedance element 704 are chosen such that the current flowing through the third impedance element 704 generates a voltage $V_B$ at the drain of the sixth transistor 702 that is substantially equal to $V_{MIN}/2$. The combination of the sixth transistor 702 and the third impedance element 704 also provides a voltage gain that causes the voltage detector 700 to be substantially insensitive to buffer threshold variations in the fast-slow and slow-fast process corners. Furthermore, the gain provided by the sixth transistor 702 and the third impedance element 704 is outside of the open-loop gain of the amplifier 200, and this has a substantially minimal effect of stability of the feedback networks formed by transistors 402, 404, 408, 410, and 412 of the amplifier 200. It is noted that the channel width and/or channel length of the sixth transistor 702 and the resistance $R_3$ of the third impedance element 704 may be chosen freely, subject to the condition that the voltage $V_B$ at the drain of the sixth transistor 702 that is substantially equal to $V_{MIN}/2$. Additionally, the additional current consumption caused by the addition of sixth transistor 702 and the third impedance element 704 is less than about 100 nA, thereby resulting in an insubstantial increase in current consumption by the voltage detector 700 in comparison to the voltage detector 300 shown in FIGS. 3 and 4.

In summary, the voltage detectors 300 and 700 described above in relation to FIGS. 3, 4, and 7 provide the above-described effects of constant and low current during its operation, power consumption that is independent of the supply voltage $V_{SUPP}$ provided by the power supply 106, robustness against PVT variations, and low manufacturing cost.

In an embodiment, a circuit may include an amplifier having a first power terminal configured to be coupled to a supply voltage and a second power terminal configured to be coupled to a reference potential. The circuit may further include a first impedance element coupled between a first input terminal of the amplifier and a first output terminal of the amplifier. The circuit may additionally include a second impedance element coupled between the first input terminal and the reference potential. The amplifier may be configured to output a first voltage at a second output terminal of the amplifier in response to the supply voltage being greater than an output voltage at the first output terminal of the amplifier. The amplifier may be further configured to output a second voltage at the second output terminal of the amplifier in response to the supply voltage being less than the output voltage at the first output terminal of the amplifier.

In an embodiment, a circuit includes a first transistor, a second transistor, a third transistor, a fourth transistor, and a fifth transistor. The first transistor may have a first conductivity type, and the second transistor may have the first conductivity type. Source terminals of the first transistor and the second transistor are coupled to each other, and gate terminals of the first transistor and the second transistor are configured to receive a bandgap reference voltage. The third transistor may have a second conductivity type, and a drain terminal and a gate terminal of the third transistor are coupled to a drain terminal of the first transistor. The fourth transistor may have the second conductivity type, and a gate terminal and a drain terminal of the fourth transistor are coupled to the gate terminal of the third transistor and a drain terminal of the second transistor, respectively. The fifth transistor may have the second conductivity type, and a drain terminal of the fifth transistor is coupled to a first output terminal. A source terminal of the fifth transistor is coupled to a supply voltage, and a gate terminal of the fifth transistor is coupled to the drain terminal of the fourth transistor and a second output terminal. The fifth transistor is configured to operate in a first mode when the supply voltage is greater than a first output voltage at the first output terminal, and in a second mode when the supply voltage is less than the first output voltage at the second output terminal.

In an embodiment, an operational amplifier, a first impedance element, a second impedance element, and a transistor. The operational amplifier includes a non-inverting input terminal, an inverting input terminal, a first output terminal, and a second output terminal. The operational amplifier further includes a first power terminal configured to be coupled to a supply voltage and a second power terminal configured to be coupled to a reference potential. The non-inverting input terminal of the operational amplifier may be to receive a bandgap reference voltage. The first impedance element is coupled between the first output terminal of the operational amplifier and the inverting input terminal of the operational amplifier. The second impedance element is coupled between the inverting input terminal of the operational amplifier and the reference potential. The transistor includes a gate terminal coupled to the second output terminal of the operational amplifier. The transistor further includes a source terminal configured to be coupled to the supply voltage, and a drain terminal configured to provide a voltage to an input terminal of a digital buffer. An operation of the transistor is controlled by a difference between the supply voltage and an voltage at the first output terminal of the operational amplifier.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The devices and processing systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a digital signal processor (DSP), an Application Specific Integrated Circuit (ASIC), a field programmable gate array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit, comprising:
   an amplifier having a first power terminal configured to be coupled to a supply voltage and a second power terminal configured to be coupled to a reference potential;
   a first impedance element coupled between a first input terminal of the amplifier and a first output terminal of the amplifier;
   a second impedance element coupled between the first input terminal and the reference potential, wherein the amplifier is configured to output a first voltage at a second output terminal of the amplifier in response to the supply voltage being greater than an output voltage at the first output terminal of the amplifier, and wherein the amplifier is configured to output a second voltage at the second output terminal of the amplifier in response to the supply voltage being less than the output voltage at the first output terminal of the amplifier; and
   a digital buffer having an input terminal coupled to the second output terminal of the amplifier, and wherein the digital buffer is configured to generate a control signal based on a comparison of the first voltage and the second voltage to a threshold voltage.

2. The circuit of claim 1, further comprising a battery configured to provide the supply voltage.

3. The circuit of claim 1, wherein a voltage at the first input terminal of the amplifier is equal to a voltage at a second input terminal of the amplifier.

4. The circuit of claim 3, wherein the first input terminal and the second input terminal of the amplifier comprises an inverting input and a non-inverting input of the amplifier, respectively.

5. The circuit of claim 1, wherein the amplifier is in a first operational state when the supply voltage is greater than the output voltage at the first output terminal of the amplifier, and wherein the amplifier is in a second operational state when the supply voltage is less than the output voltage at the first output terminal of the amplifier.

6. The circuit of claim 5, wherein the first operational state and the second operational state comprise a linear mode and a saturation mode of the amplifier, respectively.

7. The circuit of claim 1, wherein the second voltage is equal to the reference potential.

8. The circuit of claim 1, wherein the threshold voltage is equal to half of the output voltage at the first output terminal of the amplifier.

9. A circuit, comprising:
   a first transistor having a first conductivity type;
   a second transistor having the first conductivity type, wherein source terminals of the first transistor and the second transistor are coupled to each other, and wherein a gate terminal of the second transistor is configured to receive a bandgap reference voltage;
   a third transistor having a second conductivity type, wherein a drain terminal and a gate terminal of the third transistor are coupled to a drain terminal of the first transistor;
   a fourth transistor having the second conductivity type, wherein a gate terminal and a drain terminal of the fourth transistor are coupled to the gate terminal of the third transistor and a drain terminal of the second transistor, respectively; and
   a fifth transistor having the second conductivity type, wherein a drain terminal of the fifth transistor is coupled to a first output terminal, wherein a source terminal of the fifth transistor is coupled to a supply voltage, wherein a gate terminal of the fifth transistor is coupled to the drain terminal of the fourth transistor and a second output terminal, and wherein the fifth transistor is configured to operate in a first mode when the supply voltage is greater than a first output voltage at the first output terminal, and in a second mode when the supply voltage is less than the first output voltage at the second output terminal, wherein a second voltage output at the second output terminal is substantially equal to the supply voltage in response to the fifth transistor being in the first mode, and wherein the second output voltage at the second output terminal is substantially zero in response to the fifth transistor being in the second mode.

10. The circuit of claim 9, wherein the first mode and the second mode comprise a linear mode and a saturation mode of the fifth transistor, respectively.

11. The circuit of claim 9, wherein the first conductivity type and the second conductivity type comprises an n-type conductivity and a p-type conductivity, respectively.

12. The circuit of claim 9, wherein the bandgap reference voltage is about 1.2 V.

13. The circuit of claim 9, further comprising a battery and an electronic device, wherein the battery provides the supply voltage to the electronic device and the fifth transistor.

14. The circuit of claim 9, further comprising a buffer configured to generate a control signal indicative of whether the fifth transistor is operating in the first mode or the second mode, the control signal being generated based on a comparison of a second voltage output at the second output terminal against a buffer threshold voltage.

15. The circuit of claim 14, wherein the buffer threshold voltage is equal to half of the first output voltage at the first output terminal.

16. A circuit, comprising:
   an amplifier having a first power terminal configured to be coupled to a supply voltage and a second power terminal configured to be coupled to a reference potential;
   a first impedance element coupled between a first input terminal of the amplifier and a first output terminal of the amplifier; and
   a second impedance element coupled between the first input terminal and the reference potential, wherein the amplifier is in a first operational state and is configured to output a first voltage at a second output terminal of the amplifier in response to the supply voltage being greater than an output voltage at the first output terminal of the amplifier, wherein the amplifier is in a second operational state and is configured to output a second voltage at the second output terminal of the amplifier in response to the supply voltage being less than the output voltage at the first output terminal of the amplifier, wherein the first operational state and the second operational state comprise a linear mode and a saturation mode of the amplifier, respectively.

17. The circuit of claim 16, wherein a voltage at the first input terminal of the amplifier is equal to a voltage at a second input terminal of the amplifier.

18. The circuit of claim 16, wherein the first input terminal and the second input terminal of the amplifier comprises an inverting input and a non-inverting input of the amplifier, respectively.

19. The circuit of claim 16, wherein the second voltage is equal to the reference potential.

20. The circuit of claim 16, wherein a current flowing between the first output terminal of the amplifier and the first input terminal of the amplifier is constant and independent of the supply voltage.

* * * * *